July 8, 1969 M. W. BÖGL 3,454,736

SWITCH FORMED BY PACK TYPE OR MODULAR UNITS

Filed Sept. 6, 1967 Sheet 1 of 3

SWITCH FORMED BY PACK TYPE OR MODULAR UNITS

Filed Sept. 6, 1967 Sheet 2 of 3

3,454,736

SWITCH FORMED BY PACK TYPE OR MODULAR UNITS

Manfred Walter Bögl, Erlangen, Germany, assignor to International Standard Electric Corporation, New York, N.Y., a corporation of Delaware Filed Sept. 6, 1967, Ser. No. 665,922
Claims priority, application Germany, Sept. 16, 1966, S 105,909
Int. Cl. H01h 13/10
U.S. Cl. 200—168 8 Claims

ABSTRACT OF THE DISCLOSURE

A switch is formed by stacks of modules. The modules include contact elements which can be controlled by a drive shaft through the center of each of the modules. Each module is housed in a separate case and can be moved axially along the drive shaft. A plurality of contacts protruding from the sides of each module can be positioned to mate with holes in printed circuit boards by sliding the individual modules along the axis of the drive shaft to selected positions relative to the printed circuit board.

Figure 1:
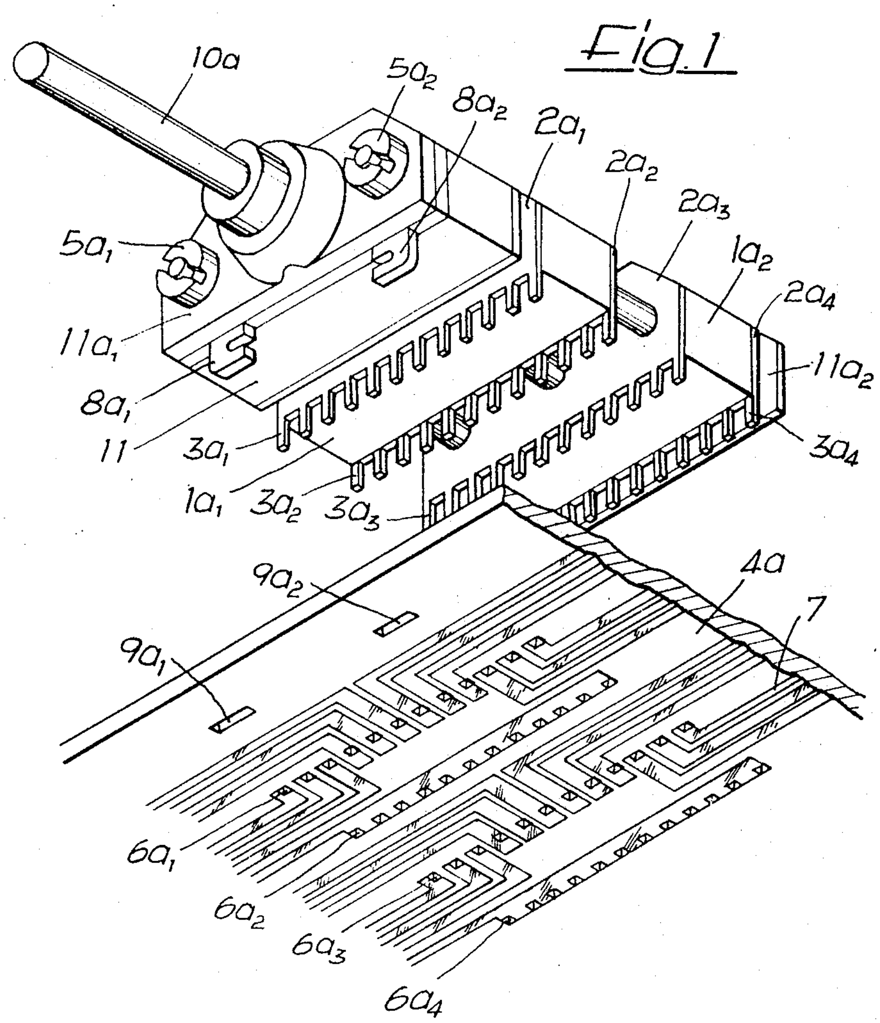

The invention relates to rotary switches or to slide switches formed by pack-type or module construction. These switches are particularly useful for installation on printed circuit boards having a pattern-like arrangement of plug-in apertures. Such switches may be used at high frequencies or low frequencies with other electronic devices for telecommunication, measurement and/or control.

For installation into printed circuits miniature multiple step-by-step rotary switches in solid layer construction are known. Such switches generally consist of several individual rotary switches arranged in layers and have a common rotary axle, an engaging mechanism common to all switches, and a number of necessary connecting, fixing and terminal components (German printed application DAS 1,170,495). For example, such multiple step-by-step switches are commonly constructed so that for each switch an isolating support in the shape of a flat plate is provided. The plates each have, on one flat side, a flat trough for holding a rotatable contacting disk with printed circuits. On both sides of said trough on the flat side of said plate flat contacting springs are fastened. The springs incorporate contact wipers resiliently touching the contact disk and soldering lugs bent at the terminal end. The isolating supports are arranged in layers so that the contact springs are kept in place by the pressure of the next following isolating support. A common flat axle is provided to drive the contact disks which axle has, when inserted, a mechanical connection to an engaging mechanism provided at one end. Difficulties arise with regard to manufacture and with regard to mounting the multiple step-by-step switch due to the construction of the soldering lugs. These soldering lugs for the printed circuits must be bent in such a way and led out so that they are within the pattern of the printed circuit and so that any bends in the mounting plate are compensated.

Still bigger difficulties occur, if the terminals are not made flexible, but are kept rigid, e.g. in the shape of pins, round wires or the like. Installation of a switch arranged like a pack into a printed circuit plate requires very exact manufacturing tolerances of the components. As such switches are required in large quantities the individual parts of the switch must be made by economical mass production. But maintaining fitting of exact manufacturing tolerances is possible only with a greater expenditure. Thereto must be added, moreover, the tolerances due to the installation of the individual components so that the use of completed pack-type switches with rigid terminals for the installation into printed circuits is nearly impossible.

Another difficulty with pack-type switches for printed circuits is that in the general trend of miniaturization of the components a minimum space for such switches is required. Due to the small dimensions it is then nearly impossible to compensate the tolerances of the pattern by bending the terminals afterwards. There is no possibility at all to do so, if the terminals are like knife-blade contacts (German Petty Patents 1,762,595 and 1,763,078) which has been printed onto the contact bank.

It is, therefore, among the objects of the present invention to provide a switch which does not exhibit the abovementioned difficulties. The inventive tasks are first, to guarantee a safe installation of a pack-type switch into a printed circuit plate without using expensive means and tools; second, to keep the switch as small as possible with regard to the installation space required and; third, despite the small size, to make it possible to produce the individual parts of the switch as economically as possible.

These objects are attained by the invention by making each rotary or slide switch, each individual contact bank and each unit composed of contact banks shiftable in the direction of its adjacent contact banks or units.

The invention is explained in detail with the aid of the accompanying drawings. The FIGS. 1 to 3 show examples of rotary switches in a pack-type or modular construction.

Figure 2:
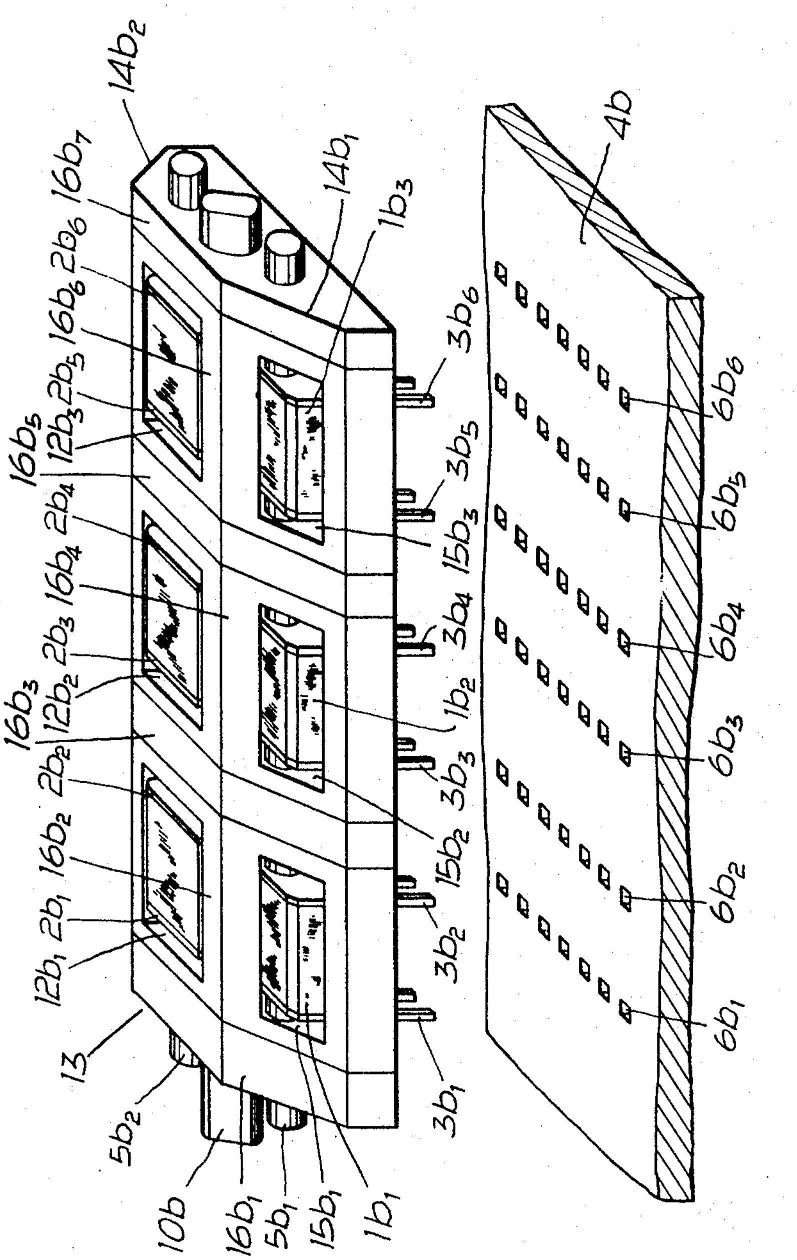
Figure 3A:
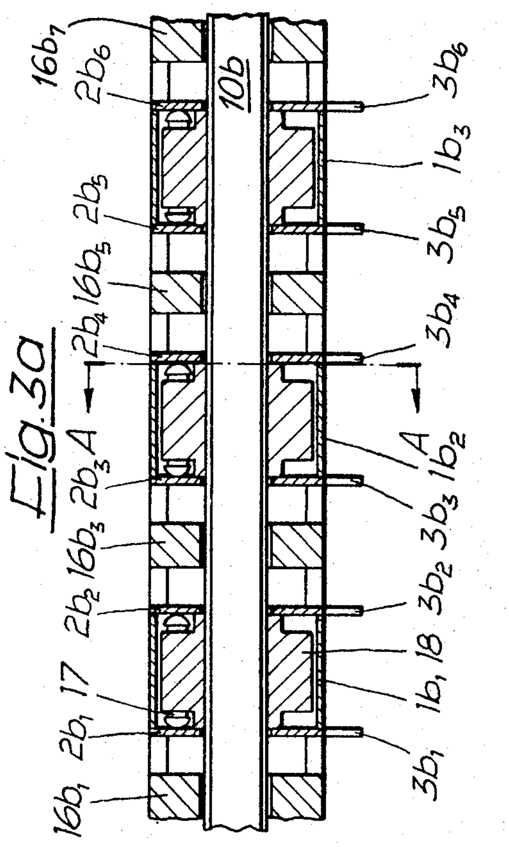
Figure 3B:
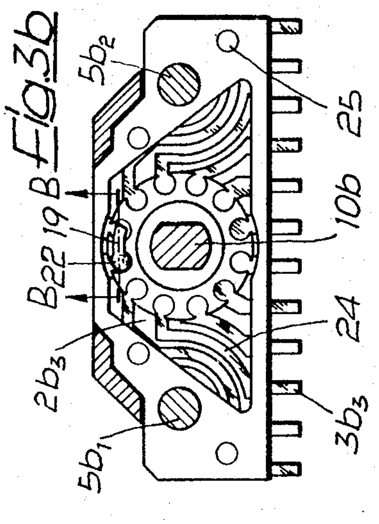
Figure 3C:
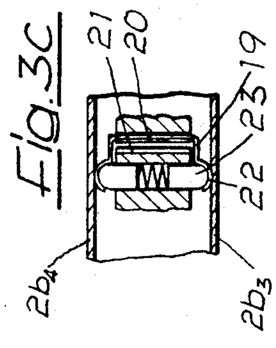

FIG. 1 and FIG. 2 each show a rotary switch and an associated printed circuit board or installation plate, respectively, in a perspective overall view, FIG. 3*a* shows a section through the rotary switch according to FIG. 2 along the rotating axle, FIG. 3*b* shows a transverse section of the rotating axle along the line A—A of FIG. 3*a*, and FIG. 3*c* shows a section along the intersecting line B—B of FIG. 3*b*, illustrating movable contact parts bearing the switching means.

The rotary switch in the pack-type construction, shown in FIG. 1, includes two units $1a_1$ and $1a_2$ arranged in layers one behind the other, which units each include two parallel fixed contact banks $2a_1$, $2a_2$, and $2a_3$, $2a_4$, respectively. These contact banks have the shape of rectangles with roof-shaped oblique parts, bearing the stationary contacting parts as well as the terminals $3a_1$ . . . $3a_4$, which are led out on one side of the switch in the pattern of the printed circuit plate 4*a*. The terminals are formed in the shape of printed soldering lugs. The metal coats of the soldering terminals are shown in the drawing in black as the soldering lugs of the terminals $3a_2$ and $3a_4$ demonstrate. The printed contact banks are manufactured by the known technique of etching off lined isolating supports. In order to compensate errors in manufacturing tolerances of the individual components of the rotary switch that cannot be avoided, the units are borne on tensioning or spanning bolts $5a_1$, $5a_2$, having an axial play. The individual units with their terminals can be shifted axially by simple manipulation and can have the space between them adjusted to the corresponding plug-in apertures $6a_1$ . . . $6a_4$. The switch can now easily be inserted into the printed circuit plate and soldered by its protruding terminal lugs with the conductor leads 7 of the printed circuit plate. The use of printed terminals at pack-type switches results in a considerable miniaturization. On the other hand only due to the freedom of axial shifting of the units is the use of printed terminals possible for an economic mass production of pack-type switches.

For mechanical fastening of the rotary switch onto the printed circuit plate soldering terminals may be used. But such construction requires a suitable shaping of the terminals to provide a formlocking or material-locking connection between the terminals and the printed circuit. To this end it may be of advantage to make the plug-in apertures in a way known per se as so-called "through-galvanized holes." For an absolutely certain mechanical connection studs $8a_1$, $8a_2$ are provided on the front side side of the rotary switch, which studs immerse so deeply into the corresponding slots $9a_1$, $9a_2$ of the printed circuit plate that they project on the side located opposite to the switch. By bending or twisting these studs, a force-locking connection can be made. For operating the switching means, located between the contact banks of a unit bearing the movable contacting parts, a common axle 10*a* is provided which simultaneously has a mechanical connection with the engaging mechanism 11 arranged on one front side. The tensioning bolts $5a_1$ and $5a_2$ are fixed and kept in place with the aid of the end parts $11a_1$ and $11a_2$.

In the rotary switch of FIG. 2 the compact units $1b_1$, $1b_2$, $1b_3$ are borne on the tensioning bolts $5b_1$, $5b_2$ with an axial play. Each unit is composed of two contact banks $2b_1$–$2b_2$, $2b_3$–$2b_4$ and $2b_5$–$2b_6$ respectively in parallel to each other. These units bear the stationary contacting parts and the terminals $3b_1$ . . . $3b_6$ arranged at the edges in rows. These terminals are also made as printed soldering lugs. The contact banks made in printed circuits are of rectangular shape with step-shaped oblique surfaces opposite to the terminal side. Due to the required mutual electrical insulation of the individual units it is suitable to limit the axial shifting of each individual unit by stops or the like on either side. To this end, approximately rectangular-shaped housing apertures $12b_1$ . . . $12b_3$ of the switch-housing 13 may be provided as shown in FIG. 2 into which apertures the units somewhat protrude with a lateral play. The switch-housing suitably is shaped square, open on the terminal side with roof-shaped oblique surfaces $14b_1$, $14b_2$, opposite to the terminal side. In these oblique surfaces also rectangular-shaped housing apertures $15b_1$ . . . $15b_3$ are arranged through which the units protrude to such an extent that they can be shifted axially through simple manipulation.

The switch-housing is composed of brick-box-like housing parts $16b_1$ . . . $16b_7$ which are pressed together with the aid of tensioning bolts $5b_1$, $5b_2$. For the drive of the switching parts bearing the movable contacting parts which connect always two contacts of the contact banks facing each other electrically, or disconnect them, a common flat axle 10*b* is provided which in turn is engaged with the rotating axle of an engaging mechanism arranged on one front side. For example, the housing part $16b_1$ can be made to accommodate the engaging mechanism. Installation of the rotary switch into the mounting plate 4*b* which possesses apertures $6b_1$ . . . $6b_6$ in a standardized pattern is made easy, since the units protruding from the housing apertures $15b_1$ . . . $15b_3$ may be shifted axially until the terminal soldering lugs can be plugged without difficulties into the apertures of the mounting plate. After plugging in the soldering lugs, they are suitably connected with the mounting plate by dip-soldering. Thereby a mechanical fixing and an electrical connection can be obtained simultaneously with the printed conductor leads arranged on the rear side of the mounting plate.

It may be gathered from FIG. 3*a* that each contact unit consists principally of two printed contact banks $3b_1$–$3b_2$, $3b_3$–$3b_4$ and $3b_5$–$3b_6$, respectively, being in parallel to each other, between which banks always one rotor 18 is borne, holding the movable contact parts 17. This rotor establishes between the contacts of the contact banks facing each other the electrical connection or disconnection.

As may be gathered from the FIGS. 3*b* and 3*c* the movable contact parts consist of one or several, substantially U-shaped contact bows the U-shaped steps 20 of which are inserted into recesses 21 of the rotor. These recesses are made so that they guarantee a rotatably safe fixing of the contact bows. The free ends of said contact bows are provided with contacting surfaces 22 which are pressed with the aid of oppositely directed pins 23 and a pressure-type spring against the contact banks $2b_3$, $2b_4$. The pressure-type spring is movably borne, together with the pins 23, in drillholes of the rotor thus securing the required contacting pressure. The contact bank $2b_3$, shown in FIG. 3*b*, is made in a printed circuit. The printed conductor leads 24 may be applied for example by etching off a lined plastic foil with subsequent surface treatment with precious metal. It is suitable to fix the plastic foils on a mechanically rigid supporting plate. On the outside of each contact bank circular holes 25 are provided to hold the fixing bolts or the like with the aid of which the contact banks are assembled to units.

The invention is not limited to rotary swtiches, but may be used also for slide switches arranged in a pack or in modules.

While the principles of the invention have been described above in connection with specific apparatus and applications, it is to be understood that this description is made only by way of example and not as a limitation on the scope of the invention.

What is claimed is:

1. A switch formed for installation on printed circuit plates, comprising:

a plurality of contact units supporting stationary contact elements, means supporting said contract units in a layer-like arrangement, and means connecting each of said contact units to a group of terminals, said means supporting said contact units including a bolt permitting axial play and enabling said units to be shifted relative to each other in order to adjust the spacing between the groups of terminals.

2. A switch as claimed in claim 1, in which stops are provided on each side of each contact unit to limit the extent of axial play.

3. A switch as claimed in claim 1, and including a housing having housing apertures into which the contact units fit, and stops formed by said housing apertures to restrict the motion of said contact units relative to each other.

4. A switch as claimed in claim 1, in which said means supporting said contact units provide alignment for two contact units thereby placing the contact elements on faces of each of said respective contact units in parallel to each other, and movable switching means, carrying mobile contact parts, positioned between the two contact units, said movable switching means serving, over said mobile contact parts, to connect and disconnect respective contact elements on the respective parallel contact units.

5. A switch as claimed in claim 1, in which the means supporting the contact units includes a housing and said housing includes openings through which the positions of the contact units may be shifted axially by single manipulation.

6. A switch as claimed in claim 4, in which the mobile contact parts include U-shaped contact bows fitted into recesses incorporated into movable switching keys, and the said contact bows include contacting surfaces on free ends of the bows which are pressed against respective contact elements with the aid of oppositely directed pins.

7. A switch as claimed in claim 6, in which the oppositely directed pins are borne in drill-holes in the mobile switching keys and are oppositely directed under the influence of a pressure-type spring.

8. A switch as claimed in claim 6, in which the movable switching means includes a cylindrical rotor with which are associated a rotating axle and an engaging mechanism.

References Cited

UNITED STATES PATENTS 3,177,306 4/1965 Mastney.

HERMAN O. JONES, *Primary Examiner*.